US010249594B2

(12) United States Patent
Gong et al.

(10) Patent No.: US 10,249,594 B2
(45) Date of Patent: Apr. 2, 2019

(54) DISPLAY DEVICE AND METHOD FOR ASSEMBLING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hongyou Gong, Beijing (CN); Haibo Zhu, Beijing (CN); Linlin Lu, Beijing (CN); Dan Zheng, Beijing (CN); Jingxian Jin, Beijing (CN); Mingquan Sun, Beijing (CN); Yulei Zhai, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 498 days.

(21) Appl. No.: 14/741,061

(22) Filed: Jun. 16, 2015

(65) Prior Publication Data

US 2016/0218079 A1    Jul. 28, 2016

(30) Foreign Application Priority Data

Jan. 23, 2015    (CN) .......................... 2015 1 0036567

(51) Int. Cl.
*H01L 23/00*     (2006.01)
*G02F 1/1345*    (2006.01)
(Continued)

(52) U.S. Cl.
CPC .......... *H01L 24/83* (2013.01); *G02F 1/13452* (2013.01); *H01L 25/167* (2013.01);
(Continued)

(58) Field of Classification Search
CPC .................................................. G02F 2202/28
See application file for complete search history.

(56) References Cited

U.S. PATENT DOCUMENTS 5,737,272 A * 4/1998 Uchiyama ........... G02F 1/13452
                                              257/E23.004
5,923,393 A * 7/1999 Chang ................. G02F 1/13452
                                              257/E23.004
(Continued)

FOREIGN PATENT DOCUMENTS

CN         101676780 A        3/2010
CN         101788736 A        7/2010
(Continued)

OTHER PUBLICATIONS

First Office Action regarding Chinese Application No. 201510036567.9, dated Mar. 28, 2017. Translation provided by Dragon Intellectual Property Law Firm.

(Continued)

*Primary Examiner* — Dung T Nguyen
(74) *Attorney, Agent, or Firm* — Harness, Dickey & Pierce, P.L.C.

(57) ABSTRACT

The present disclosure provides a display device and a method for assembling the same. The display device includes an electronic device and a flexible printed circuit board. The electronic device includes a lead region and a port located at the lead region, the flexible printed circuit board includes a first portion and a second portion. The first portion is a connector; the second portion includes connecting fingers through which the flexible printed circuit board is connected to the port through the connecting finger. The second portion of the flexible printed circuit board is arranged at a predetermined region, the predetermined region comprises the lead region and an extension region (Continued)

which is arranged outside the lead region and in a same plane where the lead region is located.

13 Claims, 2 Drawing Sheets

(51) Int. Cl.
  *H01L 51/52* (2006.01)
  *H01L 25/16* (2006.01)
(52) U.S. Cl.
  CPC ...... *H01L 51/5237* (2013.01); *G02F 1/13458* (2013.01); *G02F 2202/28* (2013.01); *H01L 2224/83203* (2013.01); *H01L 2251/5338* (2013.01); *H01L 2924/12044* (2013.01); *H01L 2924/1426* (2013.01)

(56) References Cited

U.S. PATENT DOCUMENTS

| | | | |
|---|---|---|---|
| 6,775,149 B1* | 8/2004 | Uchiyama | G02F 1/13452 257/E23.177 |
| 2006/0012745 A1* | 1/2006 | Kobayashi | G02F 1/13452 349/152 |
| 2008/0002099 A1 | 1/2008 | Oh | |

FOREIGN PATENT DOCUMENTS

| | | |
|---|---|---|
| CN | 201993555 U | 9/2011 |
| CN | 202005058 U | 10/2011 |
| CN | 202050033 U | 11/2011 |
| CN | 202178921 U | 3/2012 |
| CN | 202915166 U | 5/2013 |
| CN | 203350557 U | 12/2013 |
| CN | 103605222 A | 2/2014 |
| CN | 103629564 A | 3/2014 |
| JP | 2001209066 A | 8/2001 |
| KR | 20040039676 A | 5/2004 |
| KR | 20070049417 A | 5/2007 |

OTHER PUBLICATIONS

Second Office Action regarding Chinese Application No. 201510036567. 9, dated Dec. 11, 2017. Translation provided by Dragon Intellectual Property Law Firm.
Third Chinese Office Action regarding Application No. 201510036567.9 dated Jun. 11, 2018. Translation provided by Dragon Intellectual Property Law Firm.

* cited by examiner

DISPLAY DEVICE AND METHOD FOR ASSEMBLING THE SAME

CROSS-REFERENCE TO RELATED APPLICATION

This application claims a priority to Chinese Patent Application No. 201510036567.9 filed on Jan. 23, 2015, the disclosure of which is incorporated in its entirety by reference herein.

TECHNICAL FIELD

The present disclosure relates to the field of display, in particular to a display device and a method for assembling the same.

BACKGROUND

A flexible printed circuit board (FPCB, also referred as to a soft board), made of a polymide or polyester film, is one printed circuit board being of excellent reliability and pliability, which has advantages of a high density of wiring, a light weight, a thin thickness, and is mainly applied to a mobile phone, a laptop PC, a personal digital assistant (PDA), a digital camera, etc.

The flexible printed circuit board is generally used for supplying power and inputting a display/control signal to a display module in a display device. FIG. 1 is a schematic view showing a connection between a flexible printed circuit board and a display module within a display device in the related art, in which 1 refers to a liquid crystal display module, 2 refers to a driving chip in a lead region located at an edge of the liquid crystal module 1, 4 refers to a flexible printed circuit board connected to the liquid crystal display module 1. Connecting fingers 3 of the flexible printed circuit board 4 is attached at the lead region located at an outer end of the liquid crystal display module by thermo-compression through anisotropic conductive adhesive, and then the main body of the flexible printed circuit board 4 is bended backwardly and attached at the opposite side of the liquid crystal display module 1, at last the connecting finger region of the flexible printed circuit board 4 and the lead region of the liquid crystal display module 1 are coated with an ultraviolet (UV) adhesive 5, so as to protect the flexible printed circuit board from being destroyed and eroded.

However, for the above structure, as the flexible printed circuit board 4 needs to be bended backwardly, a position where the flexible printed circuit board 4 is bended forms a bulge at the edge of the display module, which may be destroyed or broken during operation and transportation, thereby to adversely influence the product quality and decrease the product reliability and product yield.

SUMMARY

An object of the present disclosure is to provide a display device and its assembling method, so that the flexible printed circuit board no longer needs to be bended, thereby to avoid the flexible printed circuit board being destroyed and improve the product reliability and product yield.

In one aspect, the present disclosure provides in embodiments a display device, including an electronic device and a flexible printed circuit board, wherein the electronic device comprises a lead region and a port located at the lead region, the flexible printed circuit board comprises a first portion and a second portion. The first portion is a connector, the second portion comprises a connecting fingers through which the flexible printed circuit board is connected to the port. The second portion of the flexible printed circuit board is arranged at a predetermined region, and the predetermined region comprises the lead region and an extension region which is arranged outside the lead region and in a same plane where the lead region is located.

Alternatively, the extension region is a region extending outwards from the lead region until reaching other components.

Alternatively, the flexible printed circuit board is provided with a hollow part, configured to allow a component which is arranged at the lead region to be exposed when the flexible printed circuit board is attached onto the lead region.

Alternatively, the flexible printed circuit board is of a thickness not larger than a height of the component located at the lead region.

Alternatively, the second portion covers the whole lead region.

Alternatively, the electronic device is a display module.

Alternatively, the display module is a liquid crystal panel or an organic light emitting diode panel.

Specifically, a driving chip is arranged at the lead region, the flexible printed circuit board is provided with the hollow part located at a region corresponding to the driving chip, so as to allow the driving chip to be exposed at the hollow part when the flexible printed circuit board is attached onto the lead region.

In another aspect, the present disclosure further provides in embodiments a method for assembling a display device, used to assemble the flexible printed circuit board in the above-mentioned display device to a lead region of an electronic device. The method includes: attaching a second part of the flexible printed circuit board onto a predetermined range of the electronic device, wherein the predetermined region comprises the lead region and an extension region which is arranged outside the lead region and in a same plane where the lead region is located.

Alternatively, the flexible printed circuit board covers the whole lead region.

Alternatively, the flexible printed circuit board is attached by a thermo-compression process.

For the display device and its assemble method according to embodiments of the present disclosure, each component or wiring on the flexible printed circuit board are redesigned, so as to directly attach the flexible printed circuit board at the lead region of the electronic device without a bending. The second portion of the flexible printed circuit board is arranged at a predetermined region including the lead region and an extension region which is arranged outside the lead region and in a same plane where the lead region is located. As a result, the flexible printed circuit board is prevented from being destroyed caused by bending, thereby to improve the product reliability and the product yield.

BRIEF DESCRIPTION OF THE DRAWINGS

In order to illustrate embodiments of the present disclosure and the technical solution in the prior art more clearly, drawings required therein will be described briefly hereinafter. Apparently, drawings described below are merely some examples of the present disclosure; it would be appreciated that a person skilled in the art may also obtain other drawings in accordance with these drawings without creative effort.

DETAILED DESCRIPTION

Detailed description of the present disclosure will be further described in details hereinafter in conjunction with the drawings and embodiments. Apparently, following embodiments are only a part of embodiments, but not all embodiments.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "a/an" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The present disclosure provides in embodiments a display device, including an electronic device and a flexible printed circuit board, wherein the electronic device includes a lead region and a port located at the lead region; the flexible printed circuit board includes a first portion and a second portion. The first portion is a connector, and the second portion includes connecting fingers, through which the flexible printed circuit board is connected to the port. The second portion of the flexible printed circuit board is located within a predetermine range which includes the lead region and an extension region which is arranged outside the lead region and in a same plane where the lead region is located.

Figure 1:
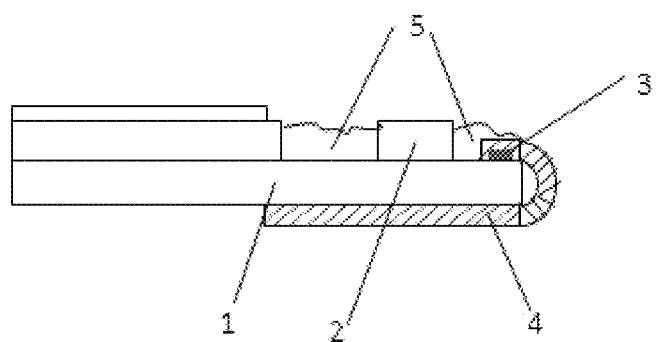
FIG. 1 is a schematic view showing a connection between a flexible printed circuit board and a display module within a display device in the related art.
Figure 2:
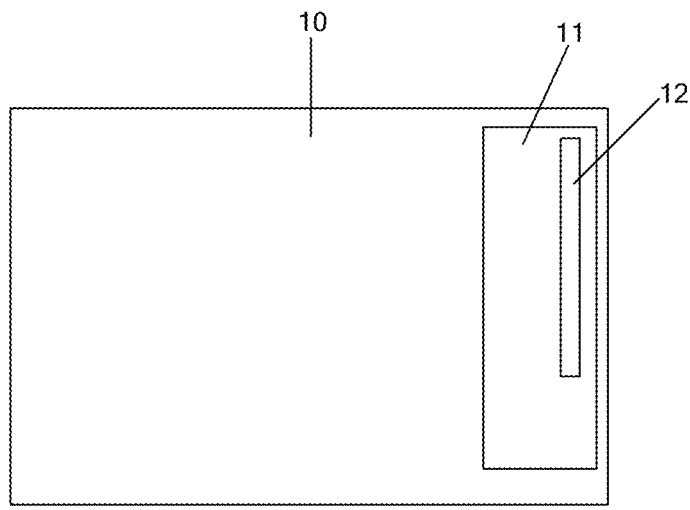
FIG. 2 is a schematic view showing a lead region of an electronic device according to an embodiment of the present disclosure.

In the present embodiment, each component and wiring on the flexible printed circuit board are redesigned and rearranged, so as to meet a certain requirement, thereby to be directly attached onto the lead region without a bend. In details, as shown in FIG. 2, which is a schematic view showing a lead region of an electronic device, 11 refers to a lead region of the electronic device 10, 12 refers to a port located in the lead region 11 and configured to connect with connecting fingers of the flexible printed circuit board.

Figure 3:
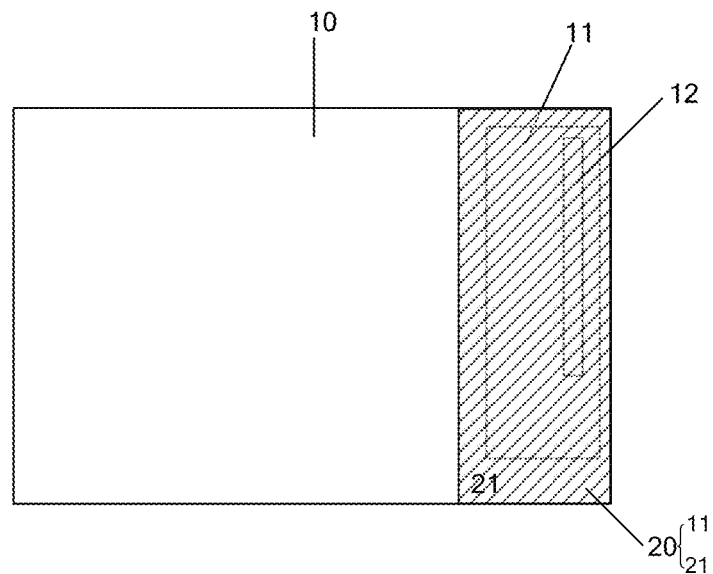
FIG. 3 is a schematic view showing a possible distribution range of a lead region of an electronic device in a flexible printed circuit board according to an embodiment of the present disclosure.

In the present embodiment, the novel flexible printed circuit board is of a size similar to that of the lead region 11. The flexible printed circuit board includes a first portion 7 and a second portion 8, wherein the first portion is a connector; and the second portion includes connecting fingers 3. When the novel flexible printed circuit board is attached onto the lead region and connected to the port 12 through the connecting fingers, the second portion of the flexible printed circuit board is located within a predetermined range 20 (the shadow part shown in FIG. 3), but the connector (i.e., the first portion 7) of the flexible printed circuit board may be arranged outside the predetermined range 20. The predetermined range 20 includes a lead region 11 and an extension region 21 which is arranged outside the lead region 11 and in a same plane where the lead region is located. In other words, when the flexible printed circuit board is assembled to an electronic device, the flexible printed circuit board may be arranged exceeding the lead region 11 and extending within a same plane where the lead region is located of the lead region 11. Such extension is stopped when reaching another device. However, the flexible printed circuit board may not be arranged extending outside the plane in which the lead region 11 is located, or bending to the opposite side of the electronic device, or adversely influencing other devices of the electronic device.

In the present disclosure, each device and wiring on the flexible printed circuit board has been redesigned and rearranged by various means, such as with an increased density of arrangement, so that when the connecting fingers 3 of the flexible printed circuit board is connected to the port 12 of the electronic device, the flexible printed circuit board is attached onto the lead region 11 and the extension region 21 of the electronic device. Then, during assembling, the flexible printed circuit board may be directly attached onto the lead region 11 without a bending, which have following advantages: reducing a possibility of destroying the flexible printed circuit board, improving the product yield; protecting the lead region, thereby to avoid the flexible printed circuit board being scratched or eroded; and enabling the electronic device thinner and the lead region more flat.

Alternatively, if other components or some bulges formed by other reasons are formed at the lead region 11, which causes that the flexible printed circuit board cannot be attached at the lead region 11 smoothly, then the flexible printed circuit board is further provided a hollow part, configured to allow the component or bulge located at the lead region to be exposed therefrom when the flexible printed circuit board is attached onto the lead region. It should note that the term "expose" may not be intended to define a position relationship between a top part of the component and a top surface of the flexible printed circuit board, i.e., the hollow part is mainly configured to accommodate other components and some bulges formed by other reasons, thereby to allow the flexible printed circuit board to be attached onto the lead region 11 smoothly.

Alternatively, the flexible printed circuit board is of a thickness not larger than a height of a component or a bulge located at the lead region, so as to make the device thinner.

Alternatively, the flexible printed circuit board covers the whole lead region, providing a protection for the lead region 11. When the flexible printed circuit board is attached at the lead region 11, it may be not required to arrange other protection film layers or protection adhesive layers on the flexible printed circuit board. Further, the flexible printed circuit board is of a shape consistent with that of the lead region 11, which does not adversely influence convenience of the electronic device shape, and provides a protection for the lead region 11 after the flexible printed circuit board is attached at the lead region 11.

The technical solution of the present disclosure is suitable for all the flexible printed circuit boards to be attached onto an electronic device. The electronic device may be any display modules such as a liquid crystal panel and an organic light emitting diode (OLED).

Accordingly, the present disclosure further provides in embodiments a novel method for assembling a display device. The method includes: attaching a second portion of the flexible printed circuit board onto an electronic device within a predetermined range, wherein the predetermined range includes the lead region and an extension region which is arranged outside the lead region and in a same plane where the lead region is located. Thus, according to embodiments of the present disclosure, there is no need to bend the flexible printed circuit board.

In order to make the technical solution of the present disclosure being understood better by those skilled in the art, detailed descriptions will be described hereinafter to illustrate the display device and its assembling method in conjunction with the drawings and the embodiments.

Figure 4:
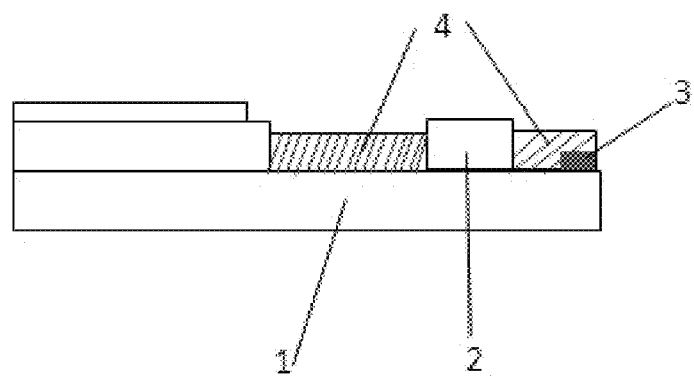
FIG. 4 is a schematic view showing a connection between a flexible printed circuit board and a display module according to an embodiment of the present disclosure.
Figure 5:
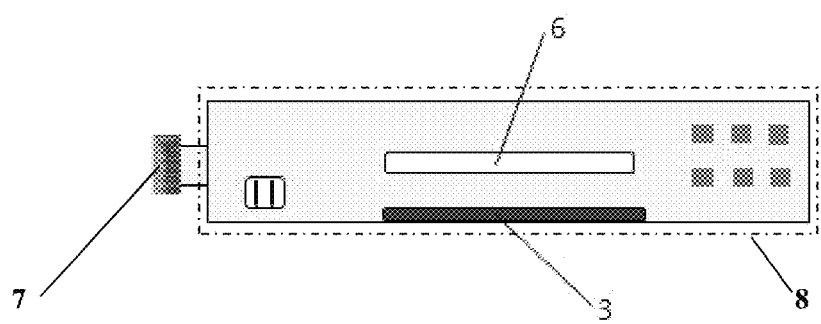
FIG. 5 is a schematic view of a flexible printed circuit board according to an embodiment of the present disclosure.

Taking a liquid crystal display module as an example, the flexible printed circuit board 4, which is connected to the liquid crystal display module, is designed to be of a rectangle shape same with that of a lead region (i.e., a PAD region) of the liquid crystal display module 1 (a connector 7 of the flexible printed circuit board 4 is not taken into account). A driving chip 2 is arranged at the lead region of the liquid crystal display module 1; the flexible printed circuit board 4 is provided with a hollow part 6 located at a region corresponding to the driving chip 2, thereby to allow the driving chip 2 to be exposed from the hollow part 6 when the flexible printed circuit board 4 is attached at the lead region, as shown in FIGS. 4 and 5.

The flexible printed circuit board 4 is directly attached at the lead region (i.e., the PAD region) of the liquid crystal display module 1; connecting fingers 3 of the flexible printed circuit board 4 is connected to a port of the liquid crystal display module 1 through anisotropic conductive adhesive, so as to achieve the connection between the flexible printed circuit board 4 and the liquid crystal display module 1.

Alternatively, the flexible printed circuit board covers the whole lead region, for providing a protection to the lead region.

Alternatively, the flexible printed circuit board is attached at the lead region by thermo-compression.

The flexible printed circuit board 4 is attached at the lead region (the PAD region) of the liquid crystal display module 1 inward, so as to avoid the flexible printed circuit board 4 being destroyed resulted from bending, and protect the lead region, as well as prevent scratching and erosion. As a result, it no longer requires coating an ultraviolet (UV) adhesive on the flexible printed circuit board 4, which saves raw materials, avoids a UV-coating process, and shortens manufacturing time. Besides, as the liquid UV adhesive has a characteristic of liquidity, this may cause an uneven coating, a local inadequate coating and an excessive coating, thereby to adversely influence the product quality. According to embodiments of the present disclosure, the UV-coating process is no longer required, which is favor of product reliability and product yield.

The driving chip 2 is exposed from the hollow part 6 of the flexible printed circuit board 4. The flexible printed circuit board 4 is of a thickness between 0.07 mm and 0.16 mm; the driving chip 2 is of a thickness of 0.2 mm. In the present embodiment, the novel flexible printed circuit board 4 and its attaching pattern not only may reduce the thickness of the liquid crystal display module, but also may not adversely influence surface flatness of the product.

In the present embodiment, the connection between the display module and the flexible printed circuit board in the display device is taken as an example for illustration, it would be appreciated that the present disclosure is not limited herein, for example, a touch flexible printed circuit board may also be applied, i.e., attached onto the lead region of the touch panel.

For the display device and its assemble method according to embodiments of the present disclosure, each component and wiring on the flexible printed circuit board are redesigned, so as to directly attach the flexible printed circuit board at the lead region of the electronic device. As a result, a bending is not needed any more and there is no adversely influence on the surface flatness of the product. The flexible printed circuit board is prevented from being destroyed caused by bending, and the thickness of the liquid crystal display module can be reduced. At the same time, the flexible printed circuit board may also provide a protection for the lead region. Further, it no longer requires manufacturing a protection film layer or adhesive layer after attaching the flexible printed circuit board at the lead region, therefore, the product reliability and the product yield are improved.

Based on reasons which have been described above, the display device has advantages such as being of low cost, thinness, excellent product reliability and high product yield, etc. The display device may be any product or component having a display function such as a liquid crystal panel, an electronic paper, an OLED panel, a mobile phone, a tablet computer, a television, a display, a laptop PC, a digital frame and a navigator.

In the specification, embodiments are described in a progressive manner, the same or similar part in various embodiments may refer to each other mutually, and those emphasized and illustrated are different parts for each embodiment.

The above are merely the specific embodiments of the present disclosure, and the scope of the present disclosure is not limited hereto. It should be noted that, a person skilled in the art may further make improvements and modifications without departing from the principle of the present disclosure, and these improvements and modifications shall also be considered as falling within the scope of the present disclosure, therefore the scope of the present disclosure shall base on the following claims.

What is claimed is:

1. A display device, comprising an electronic device and a flexible printed circuit board which are detachably connected, wherein the electronic device comprises a lead region and a port located at the lead region, the flexible printed circuit board comprises a first portion and a second portion, wherein the first portion is a connector, the second portion comprises connecting fingers through which the flexible printed circuit board is connected to the port, wherein the second portion of the flexible printed circuit board is arranged at a predetermined region, the predetermined region comprises the lead region and an extension region which is arranged outside the lead region and in a same plane where the lead region is located, and the extension region is a region extending outwards from the lead region until reaching other components and is within a surface of the electronic device where the lead region located, wherein the flexible printed circuit board is provided with a hollow part, configured to allow a component which is arranged at the lead region to be exposed when the flexible printed circuit board is attached onto the lead region, a driving chip is arranged at the lead region, the flexible printed circuit board is provided with the hollow part located at a region corresponding to the driving chip to allow the driving chip to be exposed at the hollow part when the flexible printed circuit board is attached onto the lead region.

2. The display device according to claim 1, wherein the flexible printed circuit board is of a thickness not larger than a height of the component located at the lead region.

3. The display device according to claim 1, wherein the second portion covers the whole lead region.

4. The display device according to claim 1, wherein the electronic device is a display module.

5. The display device according to claim 4, wherein the display module is a liquid crystal panel or an organic light emitting diode panel.

6. The display device according to claim 1, wherein the lead region is surrounded by the extension region.

7. The display device according to claim 1, wherein at least one side of the hollow part is in contact with the driving chip.

8. A method for assembling a display device, wherein the display device comprises an electronic device and a flexible printed circuit board which are detachably connected, the electronic device comprises a lead region and a port located at the lead region, wherein the flexible printed circuit board comprises a first portion and a second portion, wherein the first portion is a connector, the second portion comprises connecting fingers through which the flexible printed circuit board is connected to the port, the method being used to assemble the flexible printed circuit board in the display device to the lead region of the electronic device, the method comprising:

attaching the second portion of the flexible printed circuit board onto a predetermined region of the electronic device, wherein the predetermined region comprises the lead region and an extension region which is arranged outside the lead region and in a same plane where the lead region is located wherein the extension region is a region extending outwards from the lead region until reaching other components and is within a surface of the electronic device where the lead region located, wherein the flexible printed circuit board is provided with a hollow part, configured to allow a component which is arranged at the lead region to be exposed when the flexible printed circuit board is attached onto the lead region, a driving chip is arranged at the lead region, the flexible printed circuit board is provided with the hollow part located at a region corresponding to the driving chip to allow the driving chip to be exposed at the hollow part when the flexible printed circuit board is attached onto the lead region.

9. The method according to claim 8, wherein the flexible printed circuit board covers the whole lead region.

10. The method according to claim 9, wherein the flexible printed circuit board is attached by a thermo-compression process.

11. The method according to claim 8, wherein the flexible printed circuit board is attached by a thermo-compression process.

12. The method according to claim 9, wherein the lead region is surrounded by the extension region.

13. The method according to claim 9, wherein at least one side of the hollow part is in contact with the driving chip.

* * * * *